United States Patent [19]

Kawabata et al.

[11] Patent Number: 4,965,171

[45] Date of Patent: Oct. 23, 1990

[54] PHOTOPOLYMERIZABLE COMPOSITION

[75] Inventors: Masami Kawabata, Takatsuki; Masahiko Harada, Suita; Yasuyuki Takimoto, Takatsuki, all of Japan

[73] Assignee: Nippon Paint Co., Ltd., Osaka, Japan

[21] Appl. No.: 353,819

[22] Filed: May 18, 1989

Related U.S. Application Data

[62] Division of Ser. No. 147,343, Jan. 22, 1988, Pat. No. 4,868,092.

[30] Foreign Application Priority Data

Jan. 22, 1987 [JP] Japan .................................. 62-14458
May 11, 1987 [JP] Japan ................................ 62-113894

[51] Int. Cl.$^5$ ............................................... G03C 1/73
[52] U.S. Cl. ................................... 430/288; 430/914; 430/915; 430/281; 522/14; 522/15; 522/17; 522/75
[58] Field of Search .................... 522/14, 15, 17, 25; 430/281, 914, 915, 286, 288

[56] References Cited

U.S. PATENT DOCUMENTS

| | | | |
|---|---|---|---|
| 4,147,552 | 4/1979 | Specht et al. | 430/281 |
| 4,278,751 | 7/1981 | Specht et al. | 430/281 |
| 4,632,891 | 12/1986 | Banks et al. | 430/18 |
| 4,710,445 | 12/1987 | Sanders | 430/252 |
| 4,735,632 | 4/1988 | Oxman et al. | 51/295 |
| 4,792,506 | 12/1988 | Devoe et al. | 430/281 |

OTHER PUBLICATIONS

Research Disclosure, Dec. 1980, pp. 560–565, abstract no. 20036, Havant Hampshire, GB; "Photopolymerizable Compositions Featuring Novel Co-Initiators" * Whole Document *.

*Primary Examiner*—Marion C. McCamish
*Assistant Examiner*—Christopher D. RoDee
*Attorney, Agent, or Firm*—Wenderoth, Lind & Ponack

[57] ABSTRACT

Disclosed is a photopolymerizable composition which is very sensitive to visible light. The composition comprises a polymerizable compound and a photopolymerization initiator wherein the photopolymerization initiator comprises (A) a particular xanthene, coumarin or merocianine dyestuff, (B) a diaryliodonium salt and (C) a compound having the formula; R(n)—D—CH$_2$—E 9 Claims, No Drawings

PHOTOPOLYMERIZABLE COMPOSITION

This is a divisional application of pending application Ser. No. 07/147,343, filed Jan. 22, 1988, now U.S. Pat. No. 4,868,092.

FIELD OF THE INVENTION

Field of the invention

The present invention relates to a photopolymerizable composition which is sensitively cured by exposing to light sources including visible light or ultraviolet light. More particularly, the present invention relates to a photopolymerizable composition sensible to visible light, such as argon laser light.

BACKGROUND OF THE INVENTION

For an image formation by way of a photographical technique, there has been employed a photosensitive composition comprising a photosensitive component such as diazonium salts, azides or quinonediazides, or a photohardening composition comprising a photocrosslinkable component. Most of these compositions are sensitive to ultraviolet light but not sensitive to visible light. This is a problem to be solved because it is desired that printing is carried out by exposing with visible light in lieu of ultraviolet.

Scanning exposure techniques with laser beams have recently progressed so that it should be taken into consideration that these techniques are applied to imaging techniques. Especially, the use of a visible light laser, such as an argon laser, is more desired because of the aspect of energy and equipment cost. Accordingly, a composition more sensitive to visible light is strongly desired.

Japanese Patent Publication No. 114139/1982 and Japanese Patent Application Ser. No. 170599/1985 disclose a photopolymerizable composition sensitive to a visible light, wherein a dyestuff is combined with a photosensitizer. These photopolymerizable compositions are still insufficient in sensitivity to visible light and therefore, when applied to an imaging technique using laser scanning system, require a high output power laser which costs much. Accordingly, further improvement of sensitivity is required.

It has been found that a kind of xanthene, coumarin or merocyanine dyestuff is very sensitive to visible light, when combined with a polymerizable monomer, a diaryliodonium salt and a particular compound. It also has been found that a cured composition exhibits excellent physical properties for the use in the field of the invention.

SUMMARY OF THE INVENTION

The present invention provides a photopolymerizable composition which is very sensitive to visible light. The composition comprises a polymerizable compound and a photopolymerization initiator wherein the photopolymerization initiator comprises;

(A) dyestuff selected from the group consisting
 (a) a xanthene dyestuff having the following formula;

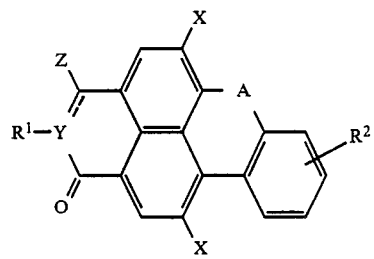

wherein A represents an oxygen atom or a sulfur atom, X represents a hydrogen atom or a halogen atom, Y represents a carbon atom or a nitrogen atom (provided that when Y represents a carbon atom, the bond with an adjacent carbon atom, which is shown by a dotted line, is a double bond and when Y represents a nitrogen atom, the bond with the adjacent carbon atom is a single bond), Z represents an oxygen atom wherein the bond with an adjacent carbon atom is a double bond, a loweralkoxy group or a loweralkanoyloxy group, $R^1$ represents a lower alkyl group, a hydroxy-loweralkyl group, di-loweralkylamino loweralkyl group or an aryl group, $R^2$ represents a hydrogen atom, a loweralkoxy group or di-loweralkylamino group, or Z and $R^1$ together represent the formula;

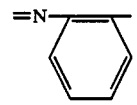

(b) a coumarin dyestuff having the following formula;

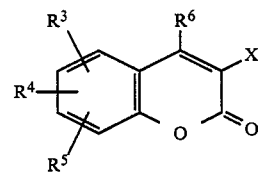

wherein X represents a hydrogen atom, a cyano group or —CO—(—CH=CH—)n—$R^{b\ 7}$ (wherein n is an integer of 0 to 2 and $R^7$ represents a hydroxyl group, a substituted or unsubstituted alkyl group having 1 to 10 carbon atoms, a substituted or unsubstituted alkoxy group having 1 to 10 carbon atoms, a substituted or unsubstituted aryl group having 6 to 12 carbon atoms, a substituted or unsubstituted aryloxy group having 6 to 12 carbon atoms or a substituted or unsubstituted heterocyclic ring in which the total number of carbon atom and hetero atom is 5 to 15), $R^3$, $R^4$ and $R^5$ respectively represent a hydrogen atom, an alkoxy group having 1 to 6 carbon atoms, an amino group, an alkyl- or dialkylamino group having 1 to 8 carbon atoms, a hydroxyl group, a halogen atom, a nitro group, a 5 or 6-membered heterocyclic ring, a substituted or unsubstituted arylazo group having 6 to 12 carbon atoms, or $R^3$ and $R^4$ or $R^4$ and $R^5$ together represent a condensed ring or condensed heteroring having 5 to 10 carbon atoms, and $R^6$ represents a hydrogen atom, an alkyl group having 1 to 4 carbon atoms, an aryl group having 6 to 12 carbon atoms or a trihalomethyl group; and (c) a merocyanine dyestuff having the following formula;

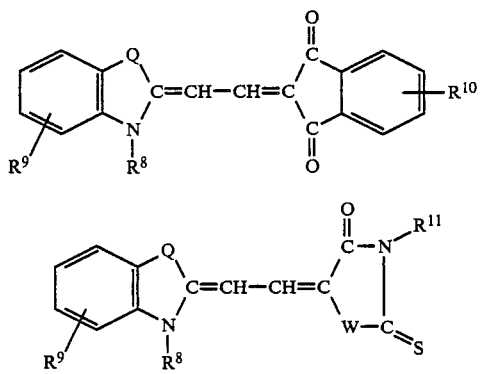

wherein Q represents an oxygen atom, a sulfur atom or —C(CH$_3$)$_2$—, W represents an oxygen atom, a sulfur atom or

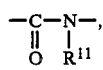

$R^8$ and $R^{11}$ respectively a hydrogen atom, a substituted or unsubstituted alkyl group or a substituted or unsubstituted aryl group, $R^9$ and $R^{10}$ respectively represent a hydrogen atom, a substituted or unsubstituted alkyl group, a substituted or unsubstituted aryl group, an alkoxy group, a nitro group, a cyano group or a halogen atom;

(B) a diaryliodonium salt, and (C) a compound having the following formula;

wherein R represents a hydrogen atom, an alkyl group having 1 to 4 carbon atoms, a phenyl group or a substituted phenyl, D represents a nitrogen atom, a sulfur atom or an oxygen atom and E represents a hydrogen atom, an alkyl group having 1 to 3 carbon atoms, a carbonyl group or a phenyl group.

DETAILED DESCRIPTION OF THE PRESENT INVENTION

The polymerizable compound of the present invention is usually a monomer or polymer having an ethylenically unsaturated bond, by which an addition polymerization occurs to cause curing. The compound preferably has a boiling point of at least 100° C.

Typical examples of the polymerizable compounds are an unsaturated carboxylic acid, an ester of unsaturated carboxylic acids and polyhydroxy compounds, an addition product of unsaturated carboxylic acids and epoxides, an esterized compound of unsaturated carboxylic acids and polycarboxylic acids with polyhydroxy compounds and the like. The polyhydroxy compounds include aliphatic or aromatic polyhydroxy compounds, and a mixture thereof. A polycarboxylic acid which does not have an unsaturated bond can be mixed with the unsaturated carboxylic acid. Examples of unsaturated carboxylic acids are acrylic acid, methacrylic acid, itaconic acid, maleic acid and the like. Examples of aliphatic polyhydroxy compounds are diols, such as ethylene glycol, diethylene glycol, triethylene glycol, tetraethylene glycol, neopentyl glycol, propylene glycol, 1,2-butanediol and the like; triols, such as trimethylolethane, trimethylolpropane, glycerol and the like; higer polyols, such as pentaerythritol, tripentaerythritol and the like; and polyhydroxycarboxylic acids. Examples of aromatic polyhydroxy compounds are hydroquinone, resolcine, catechol, pyrogallol and the like. Epoxides include trimethylolpropane polyglycidyl ether, pentaerythritol polyglycidyl ether, propylene glycol diglycidyl ether, diglycidyl ester of phthalic acid, a reaction product of epichlorohydrin with 2,2-bis(4-hydroxyphenyl)-propane and the like. Examples of polycarboxylic acids without having an unsaturated bond are phthalic acid, isophthalic acid, terephthalic acid, tetrachlorophthalic acid, trimellitic acid, pyromellitic acid, benzophenone dicarboxylic acid, glutaric acid, adipic acid, sebacic acid, tetrahydrophthalic acid and the like.

Examples of esters of aliphatic or aromatic polyhydroxy compounds and unsaturated carboxylic acids are (meth)acrylates of the above mentioned aliphatic or aromatic polyhydroxy compounds. The esters which are obtained by an esterification of polyhydroxy compounds and a mixture of unsaturated carboxylic acids and polyhydric carboxylic acids are not always a single compound and may include the followings;

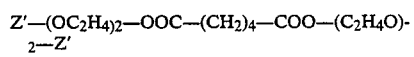

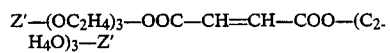

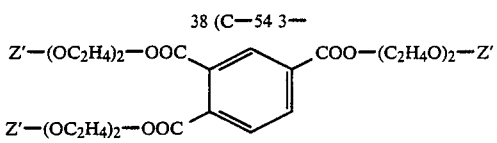

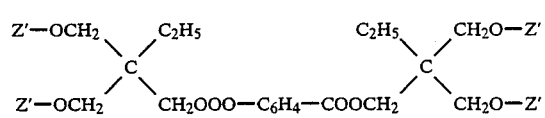

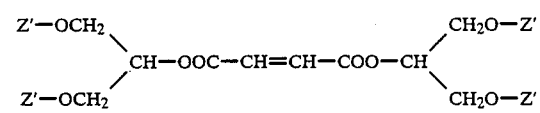

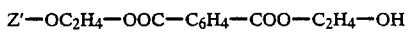

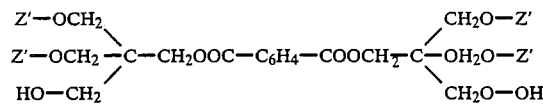

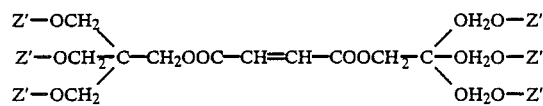

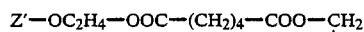
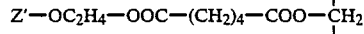
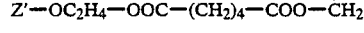

wherein Z' represents an acryloyl group or methacryloyl group.

Beside above compounds, the polymerizable compounds includes acrylamides, such as acrylamide, ethylene-bis-acrylamide, hexamethylene-bis-acrylamide and the like; methacrylamides, such as ethylene-bis-methacrylamide, hexamethylene-bis-methacrylamide and the like; allyl esters, such as diallyl phthalate, diallyl malonate, diallyl fumarate, triallyl isocyanurate; and the like.

The polymerizable compound may be a polymer having an unsaturated bond therein. Where the polymerizable compound is a polymer having an ethylenically unsaturated bond, the unsaturated bond may contain either in a main chain or branch. The polymer having an ethylenically unsaturated bond in a main chain includes a polyester obtained from a condensation reaction of an unsaturated dicarboxylic acid (maleic acid, fumaric acid and the like) and a dihydroxy compound, and a polyamide obtained from a condensation polymerization of an unsaturated dicarboxylic acid and a diamine (such as ethylenediamine and hexamethylenediamine). The polymer having a ethylenically unsaturated bond in a branch chain includes a polyester prepared from a condensation reaction of a dicarboxylic acid having an unsaturated bond in a branch (itaconic acid, α-methylitaconic acid, γ-methylitaconic acid, propylidenesuccinic acid, α-ethylideneglutaric acid, ethylidenemalonic acid, propylidenemalonic acid and the like) and a dihydroxy compound, a polyamide prepared from a condensation reaction of the dicarboxylic acid having an unsaturated bond in a branch and a diamine and the like. The polymer having an unsaturated bond in a branch may be prepared by introducing unsaturated groups to a polymer having at least one reactive functional group, such as hydroxy or halogenized alkyl. Examples of the polymers having functional groups are polyvinyl alcohol; a copolymer of polyvinyl alcohol and a copolymerizable monomer such as acrylonitrile, vinyl chloride, styrene, vinylidene chloride and the like; a partial saponificated copolymer of acrylonitrile ans vinyl acetate; a copolymer of 2-hydroxyethyl methacrylate with acrylonitrile, methyl methacrylate, butyl methacrylate, styrene, vinylidene chloride, vinyl acetate and the like; poly(4hydroxystyrene); poly(N-methylolacrylamide) and the like.

Among the above polymerizable compounds, preferred are acrylate monomers and methacrylate monomers.

According to the present invention, the photopolymerization initiator contains a dyestuff (A) selected from the group consisting of a xanthene dyestuff (a), a coumarin dyestuff (b) and a merocyanine dyestuff (c); a diaryliodonium salt (B); and a particular compound (C).

The xanthene dyestuff (a) has the formula (I) above. In the formula (I), a typical example of X is chlorine, bromine and the like. The lower alkoxy group represented by Z preferably has 1 to 5 carbon atoms, for example, methoxy, ethoxy, propoxy and the like, and the lower alkanoyloxy groups preferably has 2 to 5 carbon atoms, for example, acetyloxy, propionyloxy, butylyloxy and the like. Examples of $R^1$ are a lower alkyl group which preferably has 1 to 10 carbon atoms, such as methyl, ethyl, propyl, butyl, pentyl, hexyl, heptyl, octyl, nonyl, decyl and the like; a hydroxy lower alkyl group which preferably has 1 to 5 carbon atoms, such as hydroxymethyl, hydroxyethyl, hydroxypropyl, hydroxybutyl and the like; a lower alkoxy lower alkyl group which preferably has 2 to 10 carbon atoms, such as methoxymethyl, methoxyethyl, methoxypropyl, ethoxyethyl, ethoxypropyl, ethoxybutyl, propoxyethyl, propoxypropyl and the like; a di-loweralkyl amino loweralkyl group which preferably has 2 to 8 carbon atoms, such as dimethylaminomethyl, dimethylaminoethyl, dimethylaminopropyl, diethylaminoethyl, diethylaminopropyl, diethylaminobutyl and the like; and an aryl group, such as phenyl, xylyl, tolyl, naphthyl and the like. Examples of $R^2$ are a halogen atom, a lower alkoxy group which preferably has 1 to 5 carbon atoms, such as methoxy, ethoxy, propoxy, and the like; di-lower alkylamino group which preferably has 1 to 3 carbon atoms, such as dimethylamino, diethylamino and the like. The xanthene dyestuff (a) is already known in the art.

The coumarin (b) represented by the formula (II) above includes 3-benzoylcoumarin, 3-benzoyl-5,7-dimethoxycoumarin, 3-benzoyl-6-methoxycouramin, 3-benxoyl-7-methoxycoumarin, 3-benzoyl-8-methoxycoumarin, 3-benzoyl8-ethoxycoumarin, 3-benzoyl-6bromocoumarin, 3-benzoylbenzo[f]coumarin, 3-benzoyl-7-dimethylaminocoumarin, 3-benzoyl-7-diethylaminocoumarin, 3-benzoyl-7-(1-pyrrolidinyl)-coumarin, 3-benzoyl 7-hydroxycoumarin, 3-benzoyl-6-nitrocoumarin, acetyl-7methoxycoumarin, 3-acetyl-5,7-dimethoxycoumarin, 3-acetylbenzo[f]coumarin, 3-carboxycoumarin, 3-carboxy-7-methoxycoumarin, 3-ethoxycarbonyl-b 6-methoxylcoumarin, 3-ethoxycarbonyl-b 7-1 methoxycoumarin, 7-dimethylamino 3-(4-iodobenzoyl)coumarin, 7-diethylamino-3-(4-iodobenzoyl)coumarin, 7-diethylamino-3-(4-iodobenzoyl)-coumarin, 7-diethylamino-3-(4-diethylaminobenzoyl)-coumarin, 7-dimethylamino-3-(2-tyenoyl)coumarin, 7-diethylamino-3-(2-furoyl)coumarin, 7-diethylamino-3-(2-tyenoyl)coumarin, 7-pyrrolinidinyl-3-(2-benzofuroyl)coumarin, 7-diethylamino-3-(4-diethylaminocinnamoyl)coumarin, 7-diethylamino-3-(4-dimethylaminocinnamilideneacetyl) 7-diethylamino-3-(4-diphenylaminocinnamilideneacetyl)coumarin, 7-diethylamino-b 3-(2-benzofuroyl)coumarin, 3-(p-nitrobenzoyl)coumarin, 3-cyano-6-methoxycoumarin, 3-cyano-7-methoxycoumarin, 3-(4-nitorbenzoyl)benzo[f]coumarin, 3-(4-ethoxycinnamoyl)-7-methoxycoumarin, 3-(4-dimethylaminocinnamoyl)coumarin, 3-(4-diphenylaminocinnamoyl)coumarin, 7-methoxy-3-(p-nitrobenzoyl)coumarin, 5,7-dimethoxy-3-(4-dimethylaminocinnamoyl)coumarin, 5,7-dimethoxy-3-(4-diphenylaminocinnamoyl)coumarin, 5,7-dimethoxy-3-(4-dimethylaminocinnamilideneacetyl)coumarin, 5,7-dimethoxy-3-(4-diphenylaminocinnamilideneacetyl)-coumarin, 7-diethylamino-b 3-[3-(9; ulolidyl) acryloyl-9 coumarin, 5,7-dimethoxy-3-[3-[9-;ulolidyl)acryloyl]-coumarin, 7-amino4-methylcoumarin, 7-amino-4--trifluoromethylcoumarin, 7-dimethylanmino-4-trifluoromethylcoumarin, 7-diethylamino-4-trifluoromethylcoumarin, 7-dimethylaminocyclopenta[c]coumarin, 7-dimethylamino-4-methylcoumarin, 8-(phenylazo)-7-hydroxy-4-methylcoumarin, 8-(o-toylazo)-7-hydroxy 4-methylcoumarin, 8-(o-, m-, or p-hydroxyphenylazo)-7-hydroxy-4-methylcoumarin, 8-(p-chlorophenylazo)-7-hydroxy-4-methylcoumarin, 8-(p-bromophenylazo), 8-(p-iodophenylazo)-7-hydroxy-4-methylcoumarin, 8-(m-carboxylphenylazo)-7-hydroxy-4-methylcoumarin, 8-(p-carboxyphenylazo)-7-(p-carboxyphenylazo)-7-hydroxy-4-methylcoumarin, 8-(p-sulfonylphenylazo)7-hydroxy-4-methylcoumarin, 8-(p-nitrophenylazo)-7-hydroxy-4-methylcoumarin, 8-(p-methoxyphenylazo)-8-(p-methoxyphenylazo)-7-hydroxy-4methylcoumarin, 8-(p-dimethylaminohenylazo)-7-hydroxy-4-methylcoumarin, 3,3′-carbonylbiscoumarin, 3,3′-carbonylbis(7-methoxycoumarin), 3,3′-carbonylbis(5,7-(6-methoxycoumarin), 3,3′-carbonylbis(7-acetoxycoumarin), 3,3′-carbonylbis(5,7-diisopropoxycoumarin),33′-carbonylbis(5,7-di-propoxycoumarin), 3,3′-carbonylbis(5,7-di-n-butoxycoumarin), 3,3′-carbonylbis(7-cimethylaminocoumarin), 3,3′-carbonylbis(7-diethylaminocoumarin), 3,3′-carbonylbis(benzo[f]coumarin[, 7-diethylamino-5,7-dimethoxy-3,3-carbonylbiscoumarin, 5,7,6′-trimethoxy-3,3′-carbonylbiscoumarin, 3-(2′-benzimidazolyl)-7-diethylaminocoumarin, 3-(2′-N-methylbenzimidazolyl)-7-diethylaminocoumarin, 3-(2′-benthiazolyl)-7-diethylaminocoumarin, 3-(2′-benzthiazolyl)-4-cyano-7-diethylaminocoumarin and the like. The comarins can be prepared according to chemical Reviews, 36,1(1945); Agr. Univ. J, Reserch, 4, 345(1955) C.A. 52, 73036 and Chem. Eng. Data, 12, 624(1967) and the like. Preferred are 7-dimethylamino-3-(2-thenoyl)coumarin, 7-diethylamino-3-(2-thenoyl)-coumarin, 7-diethylamino-3-(2-furoyl) coumarin, 7-diethylamino-3-(2-tyenoyl)coumarin, 7-pyrrolidinyl-3-(2-tyenoyl(comarin, 7-pyrrolidinyl-3-(2-benzofuroyl)-coumarin, 7-diethylamino-3-(dimethylaminocinnamoyl)coumarin, 7-diethylamino-3-(4) diethylaminocinnamoyl)coumarin, 7-diethylamino-3-(4-diethylaminocinnamilideneacetyl)coumarin, 7-diethylamino-3-(4-diphenylaminocinnamilideneacetyl) coumarin, 7 diethylanmino-3-(2-benzofuroyl)coumarin, 7-diethylamino-3-[3 (9durolidyl)acryloyl]coumarin, 3,3′-carbonylbis(7-methoxycoumarin), 3,3′-carbonylbis(5,7-dimethoxycoumarin), 3,3′-carbonylbis(6-methoxycoumarin), 3,3′-carbonylbis(7-dimethylaminocoumarin) and 3,3′-carbonylbis(7-diethylaminocoumarin), in view of the increase of photosensitivity, the coumarin dyestuffs having the formula [II] are known to the art.

The dyestuff of the present invention may be the merocyanine dyestuff (c) having the formulas (ii) and (IV). In the formulas (III) and (IV), $R^8$ or $R^{11}$ represents an alkyl group, such as methyl, ethyl, n-propyl, i-propyl and t-butyl; an aryl group, such as phenyl and naphthyl; and the like. It may be substituted with a substitutent, such as methyl, ethyl, n-propyl, i-propyl, methoxy, ethoxy, chlorine, bromine, amino, a dialkylamino having 1 to 4 arcon atoms and the like. $R^9$ $R^{10}$ includes an alkoxy group, such as methoxy, ethoxy and propoxy; a halogen, such as fluorine, chlorine, and bromine; and the same group as mentioned in $R^8$ or $R^{11}$. Q represents an oxygen atom, a sulfur atom or —C(C$_3$)—, and W represents an oxygen atom, a sulfur or —CO—NR$^{11}$—. The dyestuff represented by the formula (III) and (IV) is known to the art.

The photopolymerizable composition of the present invention contains the diaryliodonium salt as the component (B). The diarliodonium salt is generally represented by the formula (VI);

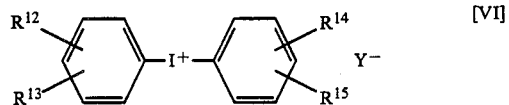

wherein $R^{12}$, $R^{13}$, $R^{14}$ and $R^{15}$, which are the same or different, are a hydrogen atom, a halogen atom (such as chlorine and bromine), a lower alkyl group having 1 to 4 carbon atoms (such as methyl, ethyl, propyl and t-butyl), a lower alkoky having 1 to 3 carbon atoms (such as methoxy, ethoxy and propoxy) and a nitro group, $Y^-$ represents a halogen ion (such as $Cl^-$, $Br^-$ and $I^-$), a hydroxyl ion, $HSO_4^-$, $BF_4^-$, $PF_6^-$, $AsF_6^-$ or $SbF_6^-$. The diaryliodonium salt having the formula [VI] can be prepared by a method as described in J. Polym. Sci. Polym. Symp. 56, 383–395 (1976). Examples of the diaryliodonium salts are chloride, bromide, tetrafluoroborate, hexafluorophosphate, hexafluoroalcenate and hexafluoroantimonate of iodomiums, such as diphenyliodonium, bis(p-chlorophenyl)iodonium, ditolyliodonium, bis(p-t-butylphenyl)iodonium an bis(m-nitrophenyl)iodonium.

The compound (C) of the present invention includes triethylamine, N-methylethanolamine, triethanolamine, N-ethyl-N-benzylaniline, N,N-diethyl-p-phenylenediamine, N-phenylglycine, N-(p-methoxyphenyl)glycine, phenoxyacetic acid, o-chlorophenoxyacetic acid, thiophenoxyacetic acid and o-chlorothiophenoxyacetic acid and the like or a mixture thereof. Preferred are N-phenylglycine.

The dyestuff (A) employed in the present invention is present in the composition in an amount of 0.01 to 0.02 part by weight, preferably 0.02 to 0.1 parts by weight based on one part by weight of the polymerizable compound. An amount of the diaryliodonium salt (B) or the compound (C) is within the range of 0.005 to 0.2 part by weight, preferably 0.01 to 0.08 part by weight based on one part of weight of the polymerizable compound. Amounts less than the lower limit of each component do not impart the required photosensitivity to the composition. It, therefore, takes a long time for curing. Amounts more than the upper limit of each component let a cured material to lower molecular weight, with causing decline of film hardness solvent-resistance and the like.

The photopolymerizable composition of the present invention may contain polymeric binders, heat-polymerization inhibitors, plasticizer and coloring agents, if desired. The polymeric binders are those improving compatibility, film-forming ability, developing capability, adhesive property. Typical examples of the polymeric binders are an acrylic acid copolymer; a methacrylic acid copolymer; an itaconic acid copolymer; a partially esterified maleic acid copolymer; a modified acid cellulose having a branched carboxyl group; a polyethylene oxide; a polyvinylpyrolidone; a polyether of epichlorohydrine and 2,2-bis(4-hydroxyphenyl)propane; a polyamine; an alkyl poly(meth)acrylate such as poly(methyl (meth)acrylate); a copolymer of an alkyl acrylate with acrylonitrile, acrylic acid, methacrylic acid, vinyl chloride, vinylidene chloride, styrene and the like; a copolymer of acrylonitrile with vinyl chloride, or vinylidene chloride; a copolymer of vinyl acetate with vinylidene chloride, a chlorinated polyolefin, or vinyl chloride; polyvinyl acetate; a styrene-acrylonitrile copolymer; ABS, polyvinyl alkyl ether, a polyvinyl alkyl ketone, polystyrene, polyaminde, polyurethane, polyethylene telephthalate, polyethylene isophthalate, acetylcellulose, polyvinyl butylal and the like. The binder may be present in the composition in an amount of not more than 10 parts by weight, preferably 0.5 to 3 parts by weight based on one part by weight of the polymerizable compound.

The heat polymerization inhibitor includes hydroquinone, p-methoxyphenol, pyrogallol, catechol, 2,6-di-t-butyl-p-cresol, βnaphthol and the like. These inhibitors are present in an amount of 0.01 to 3 parts by weight based on the total amount of the polymerizable compound and the polymeric binder.

The coloring agents include pigments such as phthalocyanine pigments, azo pigments, carbon black, titanium oxides, and the like; and dyes such as triphenylmethane dyes, azo dyes, and anthraquinone dyes. These coloring agents are present in an amount of 0.001 to 10 parts by weight of the total amount of the polymerizable compound and the polymeric binder.

The plasticizer which may contain in the photopolymerizable composition of the present invention includes dioctyl phthalate, didodecyl phthalate, dibutylphthalate, butylbenzyl phthalate, triethyleneglycol dicaprylate, dimethylglycol phthalate, tricresyl phosphate, dioctyl adipate, dibutyl adipate, dibutyl sebacate, dibutyl maleate, triacetylglycerol and the like. The amount of the plasticizer is up to 5 % by weight based on the total amount of the polymerizable compound and the polymeric binder.

In order to form a photosensitive resin layer on a substrate from the photopolymerizable composition mentioned above, the composition can be applied on the substrate directly or after dissolving in a suitable solvent followed by drying it. Suitable solvents are ketones, such as methyl ethyl ketone, acetone and cyclohexanone; esters, such as ethyl acetate, butyl acetate, amyl acetate and ethyl propionate; aromatic hydrocarbons, such as toluene, xylene, benzene, monochlorobenzene; ethylene glycol monoalkyl ether, such as ethylene glycol monomethyl ether, ethylene glycol monoethyl ether and ethylene glycol monobutyl ether; alcohols, such as methanol, ethanol and propanol; tetrahydrofuran; dioxane; and the like.

The photosensitive resin layer is optically subjected to a known treatment in order to prevent decline of sensitivity and strage stability due to oxgen. For example, the resin layer maybe covered by a removable transparent sheet or provided with a coating of wax having low permeability of oxygen or of a water-soluble or alkaline water-soluble polymer.

The photosensitive resin layer can be exposed to cure with a conventional light source containing ultraviolet or visible light, such as an argon laser, a herium-cadmium laser, a cripton laser, a high pressure mercury lamp, a xenone lamp, a metal halide lamp, a fluorescent lamp and a tungsten lamp. Development after curing may be carried out by dissolving an uncured portion with a developing solution which can be selected depending on a kind of the photosensitive resin layer.

The composition of the present invention is very sensitive to light the including ultraviolet and visible light, espesially ultraviolet to about 600nm, whereby its utilities increase. Since the composition is very sensitive to visible laser light, a scanning exposure apparatus can be employed for directly writing in a lithografic printing plate, a resist of a print circuit, and a mather plate of hologram.

EXAMPLES

The present invention is illustrated by the following examples, but they are not construed as limiting the present invention. In the examples, % and part are by weight unless otherwise specified.

EXAMPLES 1 TO 8 AND COMPARATIVE EXAMPLES 1 TO 8

Preparation of photopolymerizable composition

One hundred parts of the copolymer having a weight average molecular weight of 70,000 of methyl methacrylate and methacrylic acid (available from Mitsubishi Rayon Co., Ltd. as BR-77) was dissolved in 1,000 parts of methyl ethyl ketone, followed by adding 100 parts of pentaerythritol triacrylate to form a first solution.

Next, a photopolymerization initiator containing the components (A), (B) and (C) in the amount shown in Table 1 was dissolved in 300 parts of ethylene glycol monomethyl ether to form a second solution.

The second solution was added to the first solution to form a solution of a phopolymerizable composition.

Preparation of Photosensitive Resin Layer (Test Panel)

The composition obtained above was coated on an aluminum substrate in a coating amount of 2 g/m$^2$ by using a bar coater and dried at 60 ° C. for three minutes to obtain a photosensitive layer on the substrate having a thickness of 2.0 μm. An overcoat layer having a thickness of 2.0 μm was formed on the photosensitive layer by coating a 5 % solution of polyvinyl alcohol (saponification degree 88 %; polymerization degree 500) with a bar coater.

Photosensitivity

The obtained panels were piled with Kodak Step Tablet No.2 (21 steps) followed by exposing for ten seconds to a light having a wave length of around 490 nm and a light intensity of 4.0 mW/cm$^2$, obtained from a xenone lamp of 150 W (available from Ushio Electric Co. Ltd.) through a filter. It was then developed with a developing solution containing 10 parts by weight of sodium hydrogencarbonate, 50 parts by weight of ethylene glycol monobutyl ether, 3 parts by weight of an anionic surfactant and 1,000 parts by weight of water. An exposing energy was calculated from the step number when cured, and is expressed as "sensitivity'. The result is shown in Table 1.

Argon Laser Sensitivity

Next, The test panel was exposed by cylindrically scanning a laser light (488 nm) with modulating by a modulator (1,000 rpm, 600 lines/inch), wherein the laser light was one condensed into a beam diameter of 20 μm from a 0.2 W argon laser light source through a optical system. The plate was then developed with the developing solution to obtain an image. The appearance of the obtained image is shown in Table 1.

For a comparison, a composition not containing one of the components (B) and (C) was obtained as shown in Table 1 and the same tests were carried out as mentioned above. The result is shown in Table 1.

TABLE 1

| Examples | Photopolymerization initiator | | | Sensitivity (mJ/cm$^2$) | Appearance of an image obtained by the argon laser |
|---|---|---|---|---|---|
| | Component (A) (parts) | Component (B) (parts) | Component (C) (parts) | | |
| 1 | A-1 (6) | B-1 (3) | C-1 (3) | 0.6 | Distinct |
| 2 | A-1 (6) | B-1 (6) | C-1 (3) | 0.6 | Distinct |
| 3 | A-1 (6) | B-1 (3) | C-1 (6) | 0.3 | Distinct |

TABLE 1-continued

| Examples | Photopolymerization initiator | | | Sensitivity (mJ/cm$^2$) | Appearance of an image obtained by the argon laser |
|---|---|---|---|---|---|
| | Component (A) (parts) | Component (B) (parts) | Component (C) (parts) | | |
| 4 | A-1 (6) | B-1 (6) | C-1 (6) | 0.3 | Distinct |
| 5 | A-1 (6) | B-2 (3) | C-1 (3) | 0.6 | Distinct |
| 6 | A-1 (6) | B-1 (3) | C-2 (3) | 0.7 | Distinct |
| 7 | A-2 (6) | B-1 (3) | C-1 (3) | 0.6 | Distinct |
| 8 | A-2 (6) | B-2 (3) | C-1 (3) | 0.6 | Distinct |
| Comparative Ex. | | | | | |
| 1 | A-1 (6) | B-1 (3) | — | 1.8 | No image was obtained. |
| 2 | A-1 (6) | B-1 (6) | — | 1.8 | No image was obtained. |
| 3 | A-1 (6) | B-1 (9) | — | 1.4 | Not distinct |
| 4 | A-1 (6) | B-1 (12) | — | 1.4 | Not distinct |
| 5 | A-1 (6) | — | C-1 (3) | 1.6 | No image was obtained. |
| 6 | A-1 (6) | — | C-1 (6) | 1.4 | Not distinct |
| 7 | A-1 (6) | — | C-1 (9) | 1.4 | Not distinct |
| 8 | A-1 (6) | — | C-1 (12) | 1.8 | No image was obtained. |

A-1: A compound having the formula (I), wherein A = S, X = H, Y = C, Z = OC$_2$H$_5$, R$^1$ = C$_6$H$_5$ and R$^2$ = H.
A-2: A compound having the formula (I), wherein A = O, X = Cl, Y = N, Z = O, R$^1$ = C$_2$H$_5$O(CH$_2$)$_3$ and R$^2$ = N(C$_2$H$_5$)$_2$.
B-1: Diphenyliodonium borofluoride.
B-2: Di-p-tolyliodonium tetrafluoroborate.
C-1: N-Phenylglycine.
C-2: Triethanolamine.

A-1: A compound having the formula (I), wherein A=S, X=H, Y=C, Z=OC$_2$5, R$^1$=C$_6$H$_5$ R$^2$=H.
A-2: A compound having the formula (I), wherein A=O, X=Cl, Y=N, Z=O, R$^1$=C$_2$H$_5$O(CH$_2$)$_3$ and R$^2$=N(C$_2$H$_5$)$_2$.
B-1:Diphenyliodonium borofluoride.
B-2:Di-p-tolyliodonium tetrafluoroborate.
C-2:Triethanolamine.

EXAMPLE 9

An experiment was carried out as generally described in Example 1 with the exception that 100 parts of an addition product of 2 mol of acrylic acid to one mol of propylene glycol diglycidyl ether was employed instead of 100 parts of pentaerythritol triacrylate. As the result, its sensitivity was 0.6 mJ/cm$^2$ and a distinct image was obtained by the argon laser.

EXAMPLES 10 TO 13 AND COMPARATIVE EXAMPLES 9 TO 12

An experiment was carried out as generally described in Example 1 with the exception that the phopolymerizable initiator was prepared from the components shown in Table 2 and a 0.1 W argon laser light source was employed in the test of argon ion laser sensitivity. The result is shown in Table 2.

Component B: Diphenyliodonium tetrafluoroborate.
Component C: N-Phenylglycine.

EXAMPLE 14

An experiment was carried out as generally described in Example 13 with the exception that 6 parts of diphenyliodonium chloride was employed instead of 6 parts of diphenyliodonium fluoroborate. As the result, its sensitivity was 0.1 mJ/cm$^2$ and a distinct image was obtained by the argon ion laser.

EXAMPLE 15

An experiment was carried out as generally described in Example 13 with the exception that 6 parts of N-ethyl-N-benzylaniline was employed instead of 6 parts of N-phenylglycine. As the result, its sensitivity was 0.3 mJ/cm$^2$ and a distinct image was obtained by the argon laser.

EXAMPLE 16

An experiment was carried out as generally described in Example 13 with the exception that 100 parts of an addition product of 2 mol of acrylic acid to one mol of propylene glycol diglycidyl ether was employed instead of 100 parts of pentaerythritol triacrylate . As the result, its sensitivity was 0.1 mJ/cm$^2$ and a distinct

TABLE 2

| Examples | Photopolymerization initiator | | | Sensitivity (mJ/cm$^2$) | Appearance of an image obtained by the argon laser |
|---|---|---|---|---|---|
| | Component (A) (parts) | Component (B) (parts) | Component (C) (parts) | | |
| 10 | (6) | (3) | (3) | 0.3 | Distinct |
| 11 | (6) | (6) | (3) | 0.2 | Distinct |
| 12 | (6) | (3) | (6) | 0.2 | Distinct |
| 13 | (6) | (6) | (6) | 0.1 | Distinct |
| Comparative ex. | | | | | |
| 9 | (6) | — | (3) | 2.9 | No image was obtained. |
| 10 | (6) | — | (6) | 1.2 | No image was obtained. |
| 11 | (6) | — | (9) | 1.2 | No image was obtained. |
| 12 | (6) | — | (12) | 1.2 | No image was obtained. |

Component A: 3,3'-Carbonylbis(7-diethylaminocoumarin).
Component B: Diphenyliodonium tetrafluoroborate.
Component C: N-Phenylglycine.

Component A: 3,3'-Carbonylbis(7-diethylaminocoumarin).

image was obtained by the argon laser.

Example 17 and Comparative Example 13

A test panel was obtained as generally described in Example 13 with the exception that 6 parts of 7-(diethylamino)-4-trifluoromethylcoumarin was employed instead of 6 parts of 3,3'-carbonylbis(7-diethylaminocoumarin). The panel was piled on a step tablet No. 2 (21 steps) and exposed to a 3 KW high pressure mercury lamp for 5 seconds. The panel was developed to cure 10 steps.

For a comparison, a panel was prepared without employing diphenyliodonium tetrafluoroborate and exposed and developed as mentioned above. It cured 5 steps.

EXAMPLE 18

An experiment was carried out as generally described in Example 13 with the exception that 6 parts of 7-diethylamino-3-(4-dimethylaminocinnamoyl)coumarin was employed instead of 6 parts of 3,3'-carbonylbis(7-diethylaminocoumarin). As the result, its sensitivity was 0.3 mJ/cm$^2$ and a distinct image was obtained by the argon laser.

EXAMPLE 19

An experiment was carried out as generally described in Example 13 with the exception that 6 parts of 7-diethylamino-3-(2-tenoyl)coumarin was employed instead of 6 parts of 3,3'-carbonylbis(7-diethylaminocoumarin). As the result, its sensitivity was 0.2 mJ/cm$^2$.

EXAMPLES 20 TO 27 AND COMPARATIVE EXAMPLES 14 TO 27

An experiment was carried out as generally described in Example 1 with the exception that the phopolymerizable initiator was prepared from the components shown in Table 3 and a 0.3 W argon laser light source was employed in the test of argon laser sensitivity. The result is shown in Table 3.

TABLE 3

| | Photopolymerization initiator | | | | Appearance of an image |
|---|---|---|---|---|---|
| | Component (A) (parts) | Component (B) (parts) | Component (C) (parts) | Sensitivity (mJ/cm$^2$) | obtained by the argon laser |
| Examples | | | | | |
| 20 | A-3 (6) | B-3 (3) | C-1 (3) | 0.9 | Distinct |
| 21 | A-3 (6) | B-4 (3) | C-1 (3) | 0.9 | Distinct |
| 22 | A-3 (6) | B-3 (3) | C-2 (6) | 1.3 | Distinct |
| 23 | A-4 (6) | B-3 (3) | C-1 (3) | 0.6 | Distinct |
| 24 | A-5 (6) | B-4 (3) | C-2 (6) | 1.8 | Slightly distinct |
| 25 | A-6 (6) | B-3 (3) | C-1 (3) | 2.2 | Slightly distinct |
| 26 | A-7 (6) | B-3 (3) | C-1 (3) | 1.3 | Distinct |
| 27 | A-8 (6) | B-4 (3) | C-1(3) | 2.2 | Slightly distinct |
| Comarative ex. | | | | | |
| 14 | a-3 (6) | B-3 (3) | — | 6.5 | No image was obtained. |
| 15 | A-3 (6) | B-3 (6) | — | 4.7 | Not distint |
| 16 | A-3 (6) | — | C-1 (3) | 26.0 | No image was obtained. |
| 17 | A-3 (6) | — | C-1 (6) | 18.4 | No image was obtained. |
| 18 | A-4 (6) | B-3 (6) | — | 4.7 | Not distinct |
| 19 | A-4 (6) | — | C-1 (6) | 18.4 | No image was obtained. |
| 20 | A-5 (6) | B-4 (6) | — | 9.4 | No image was obtained. |
| 21 | A-5 (6) | — | C-2 (6) | 26.0 | No image was obtained. |
| 22 | A-6 (6) | B-3 (6) | — | 9.4 | No image was obtained. |
| 23 | A-6 (6) | — | C-1 (6) | more than 40 | No image was obtained. |
| 24 | A-7 (6) | B-3 (6) | — | 6.5 | No image was obtained. |
| 25 | A-7 (6) | — | C-1 (6) | more than 40 | No image was obtained. |
| 26 | A-8 (6) | B-4 (6) | — | 13.0 | No image was obtained. |
| 27 | A-8 (6) | — | C-1 (6) | 36.4 | No image was obtained. |

A-3 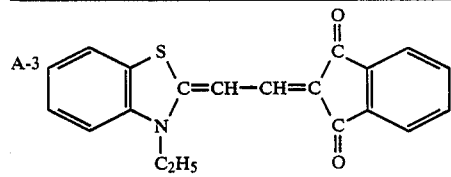

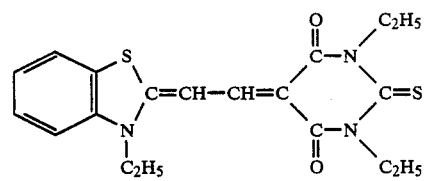

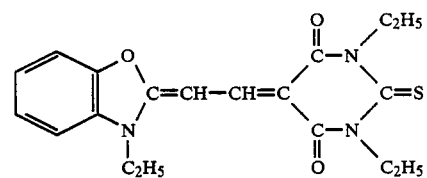

TABLE 3-continued

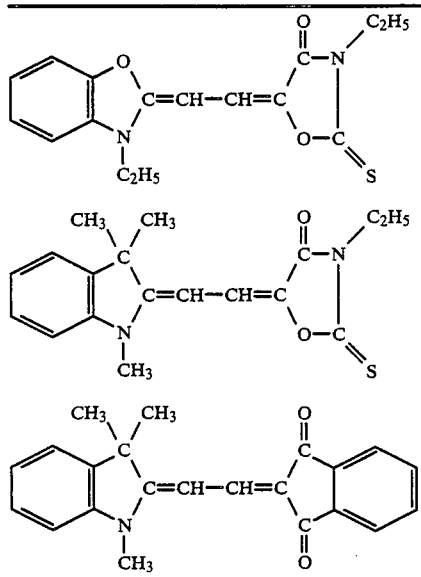

B-1: Diphenyliodonium chloride.
B-2: Diphenyliodonium tetrafluoroborate.

What is claimed is:

1. A photopolymerizable composition comprising a polymerizable compound having an ethylenically unsaturated double bond and a photopolymerization initiator wherein the photopolymerization initiator comprises:

A coumarin dyestuff having the following formula;

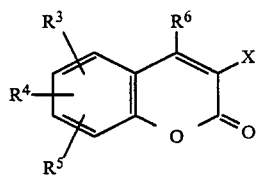

wherein X represents a hydrogen atom, a cyano group or —CO—(—CH=CH—)n—$R^7$, wherein n is an integer of 0 to 2 and $R^7$ represents a hydroxyl group, a substituted or unsubstituted alkyl group having 1 to 10 carbon atoms, a substituted or unsubstituted alkoxy group having 1 to 10 carbon atoms, a substituted or unsubstituted aryl group having 6 to 12 carbon atoms, a substituted or unsubstituted aryloxy group having 6 to 12 carbon atoms or substituted or unsubstituted heterocyclic ring in which the total number of carbon atoms and herero atoms is 5 to 15, $R^3$, $R^4$ and $R^5$ respectively represent a hydrogen atom, an alkoxy group having 1 to 6 carbon atoms, an amino group, an alkyl- or dialkyl-amino group having 1 to 8 carbon atoms, a hydroxyl group, a halogen atom, a nitro group, a 5 to 6-membered heterocyclic ring, a substituted or unsubstituted arylazo group having 6 to 12 carbon atoms, or $R^3$ and $R^4$ and $R^5$ together represents a condensed ring or condensed hetero ring having 5 to 10 carbon atoms, and $R^6$ represents a hydrogen atom, an alkyl group having 1 to 4 carbon atoms, an aryl group having 6 to 12 carbon atoms or a trihalomethyl group, a diaryliodonium salt, and a compound selected from the group consisting of triethylamine, N-methylethanolamine, triethanolamine, N-ethyl-N-benzylaniline, N,N-diethyl-p-phenylenediamine, N-phenylglycine, or a mixture thereof thiophenoxyacetic acid and o-chlorothiophenoxyacetic acid.

2. The composition of claim 1 wherein the diaryliodonium salt has the following formula;

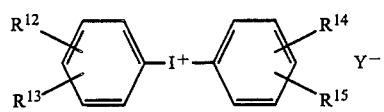

wherein $R^{12}$, $R^{13}$, $R^{14}$ and $R^{15}$, which are the same or different, are a hydrogen atom, a halogen atom, a lower alkyl group, a lower alkoxy group or a nitro group, and $Y^-$ represents a halogen ion, a hydroxyl ion, $HSO_4^-$, $BF_4^-$, $PF_6^-$, $AsF_6^-$ or $SbF_6^{31}$.

3. The composition of claim 1 wherein the compound (C) is N-phenylglycine, triethanolamine or a mixture thereof.

4. The composition of claim 1 wherein the dyestuff is present in the composition in an amount of 0.01 to 0.2 part by weight based on one part by weight of the polymerizable compound.

5. The composition of claim 1 wherein the diaryliodomium salt is present in the composition in an amount of 0.005 to 0.2 part by weight based on one part by weight of the polymerizable compound.

6. The composition of claim 1 wherein the polymerizable compound has two ethylenically unsaturated bonds in one molecule.

7. The composition of claim 1 wherein the polymerizable compound has a boiling point of at least 100° C.

8. The composition of claim 1 wherein the composition further comprises a polymeric binder.

9. The composition of claim 1 wherein the dyestuff (A) is present in amount of 0.01 to 0.2, based upon one part by weight of the polymerizable compound, the diaryliodonium salt (B) is present within the range of 0.005 to 0.2 part by weight per one part by weight of the polymerizable compound and the compound (C) is also present within the range of 0.05 to 0.2 part by weight, per one part by weight of the polymerizable compound.

* * * * *